(12) United States Patent
McVittie

(10) Patent No.: US 10,069,278 B1
(45) Date of Patent: Sep. 4, 2018

(54) DYNAMIC LASER DIODE COMPENSATION

(71) Applicant: Microvision, Inc., Redmond, WA (US)

(72) Inventor: Patrick J. McVittie, Seattle, WA (US)

(73) Assignee: Microvision, Inc., Redmond, WA (US)

( * ) Notice: Subject to any disclaimer, the term of this patent is extended or adjusted under 35 U.S.C. 154(b) by 0 days.

(21) Appl. No.: 15/839,423

(22) Filed: Dec. 12, 2017

(51) Int. Cl.
*H01S 3/13* (2006.01)
*H01S 5/068* (2006.01)
*H01S 5/0683* (2006.01)
*H01S 5/06* (2006.01)
*H01S 5/00* (2006.01)

(52) U.S. Cl.
CPC ........ *H01S 5/06812* (2013.01); *H01S 5/0021* (2013.01); *H01S 5/0035* (2013.01); *H01S 5/0617* (2013.01); *H01S 5/06825* (2013.01); *H01S 5/06832* (2013.01); *H01S 2301/06* (2013.01)

(58) Field of Classification Search
CPC ............. H01S 5/06832; H01S 5/06812; H01S 5/0617; H01S 5/06825; H01S 5/0021; H01S 5/0036; H01S 2301/06
See application file for complete search history.

(56) References Cited

U.S. PATENT DOCUMENTS

| | | | | |
|---|---|---|---|---|
| 5,936,986 A | * | 8/1999 | Cantatore | G01N 15/14 372/31 |
| 2003/0007722 A1 | * | 1/2003 | Caroli | H04J 14/0206 385/24 |
| 2003/0152390 A1 | * | 8/2003 | Stewart | H04B 10/07957 398/135 |
| 2009/0201956 A1 | * | 8/2009 | Kanesaka | H01S 5/0683 372/29.021 |

* cited by examiner

*Primary Examiner* — Kinam Park
(74) *Attorney, Agent, or Firm* — Kevin D. Wills

(57) ABSTRACT

A laser drive circuit compensates for laser diode dynamics. A compensation value is determined from a sum of weighted basis functions. The basis functions may be a function of current desired optical powers and/or past desired optical powers. The weights may be updated periodically based at least in part on accumulated basis function outputs and measured optical powers.

20 Claims, 13 Drawing Sheets

DYNAMIC LASER DIODE COMPENSATION

FIELD

The present invention relates generally to compensation in optical systems, and more specifically to compensation for dynamic changes in laser diode operating characteristics.

BACKGROUND

Laser diodes emit light when current is passed through the diode. The optical power of the light varies as the drive current through the diode is varied. FIG. 1 shows a prior art laser diode drive circuit that includes a laser diode 110, a digital-to-analog converter (DAC) and driver circuit 108, and an inverse laser model 101. In operation, a value representing a desired optical light power is provided to the inverse laser model 101. Inverse laser model 101 maps the desired optical power value to a different drive value to compensate for the nonlinear operating characteristic of diode 110. The drive value is then provided to the DAC/driver circuit 108, which then drives diode 110 with a drive current, resulting in emitted light 112.

FIG. 2 shows prior art curves used in the drive circuit of FIG. 1. Curve 220 shows an idealized nonlinear diode operating characteristic. This typical diode curve is well known and shows that a negligible (or zero) amount of light is produced below a certain threshold current, and then above the threshold, the amount of light produced is a nonlinear function of drive current.

Curve 230 shows a desired linear relationship between desired optical power and output optical power that is actually produced by the diode. Curve 210 shows the inverse laser model that, when combined with the operating characteristic shown by curve 220, will result in the desired linear relationship shown at 230.

Using an inverse laser model as shown in FIGS. 1 and 2 works well to linearize the relationship between desired optical power and output optical power when the laser diode operating characteristic is time-invariant. Unfortunately, laser diode characteristics are not always time-invariant. For example, the output optical power of the laser diode may vary with age, temperature changes, and other factors.

DESCRIPTION OF EMBODIMENTS

Figure 1:
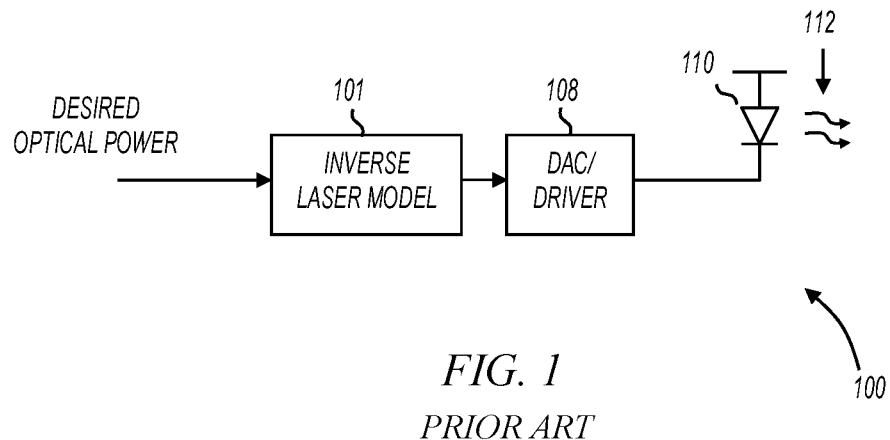
FIG. 1 shows a prior art laser diode drive circuit.

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein in connection with one embodiment may be implemented within other embodiments without departing from the scope of the invention. In addition, it is to be understood that the location or arrangement of individual elements within each disclosed embodiment may be modified without departing from the scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

Figure 3A:
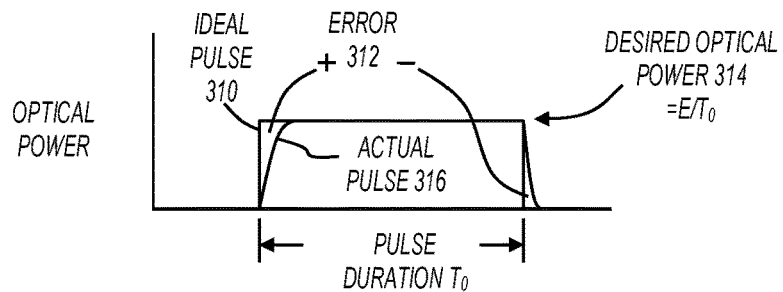
FIGS. 3A and 3B show how short laser light pulse durations can contribute to errors in optical energy in accordance with various embodiments of the present invention.
Figure 3B:
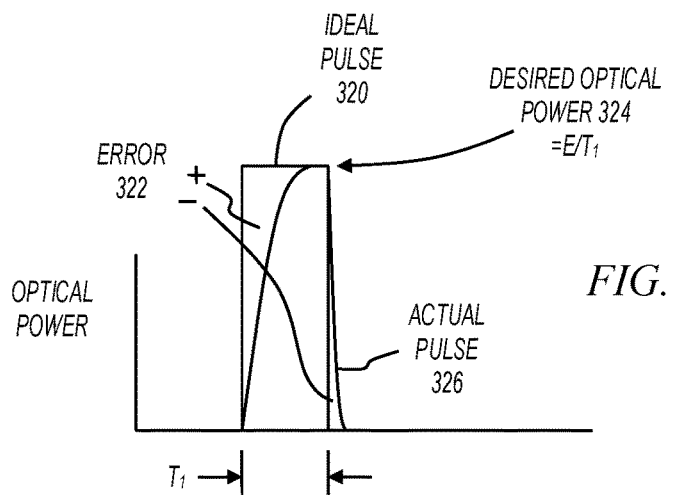

FIGS. 3A and 3B show how short laser light pulse durations can contribute to errors in optical energy in accordance with various embodiments of the present invention. The pulses in FIGS. 3A and 3B represent pulses of light emitted from a laser diode, such as laser diode 110 (FIG. 1). Both FIGS. 3A and 3B show ideal pulses 310, 320 having identical optical energy E. Because the optical energy is the product of optical power and pulse duration, the desired optical power is given by:

$$P = E/T \quad (1)$$

where P is the desired optical power, E is the optical energy of the pulse, and T is the pulse duration.

Ideal pulse 310 (FIG. 3A) has duration $T_0$, and ideal pulse 320 (FIG. 3) has shorter duration $T_1$. As shown in FIGS. 3A and 3B, the desired optical power 324 is a higher magnitude than desired optical power 314 because of the difference in pulse durations.

FIGS. 3A and 3B also show actual pulses 316, 326 with finite rise and fall times. The finite rise and fall times may be attributable to any cause, including for example, driver circuit nonlinearities, laser diode nonlinearities, and device physics. The finite rise and fall times can introduce errors in laser light pulse optical energies. For example, as shown in FIG. 3A, optical energy error 312 represents the difference in optical energies of ideal pulse 310 and actual pulse 316. Similarly, as shown in FIG. 3B, optical energy error 322 represents the difference in optical energies of ideal pulse 320 and actual pulse 326.

Error 322 is a larger percentage error than error 312. This larger error is caused in part by the combination of short pulse durations and finite rise and fall times. Various embodiments of the present invention compensate for this error, as further described below.

Figure 4:
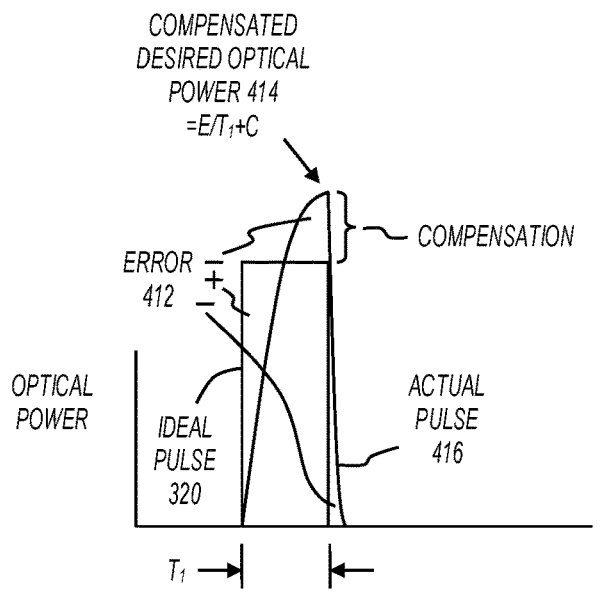
FIG. 4 shows first order rise time correction in accordance with various embodiments of the present invention.

FIG. 4 shows rise time correction in accordance with various embodiments of the present invention. FIG. 4 shows the same ideal pulse 320 that is shown in FIG. 3B. To compensate for the error described above, the desired optical power 414 has been increased to $$P = E/T + C \tag{2}$$

where C is a compensation value that is added to the desired optical power value. As shown in FIG. 4, the error is reduced in part because the optical power of the actual pulse 416 is greater than the optical power of the ideal pulse for a portion of the pulse duration. As described further below, various embodiments of the present invention determine appropriate values for C based on many criteria. For example, some embodiments determine values for C as a function of the desired optical power. Also for example, some embodiments determine values for C based on past desired optical powers.

Figure 5:
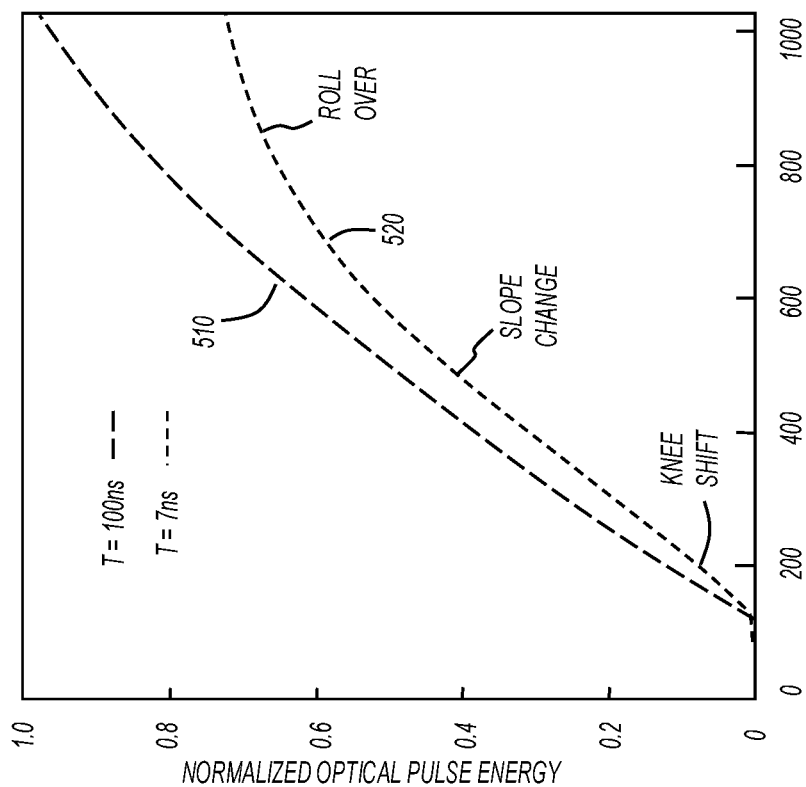
FIG. 5 shows the effects of short pulse durations as a function of desired optical power values in accordance with various embodiments of the present invention.

FIG. 5 shows the effects of short pulse durations as a function of desired optical power values in accordance with various embodiments of the present invention. Curve 510 represents normalized optical pulse energies for 100 ns (nanosecond) pulses as a function of desired optical power values, and curve 520 represents normalized optical pulse energies for 7 ns pulses as a function of desired optical power values. The desired optical power values are shown as ten bit digital numbers ranging in value from zero to 1023, but this is not a limitation of the present invention.

Figure 2:
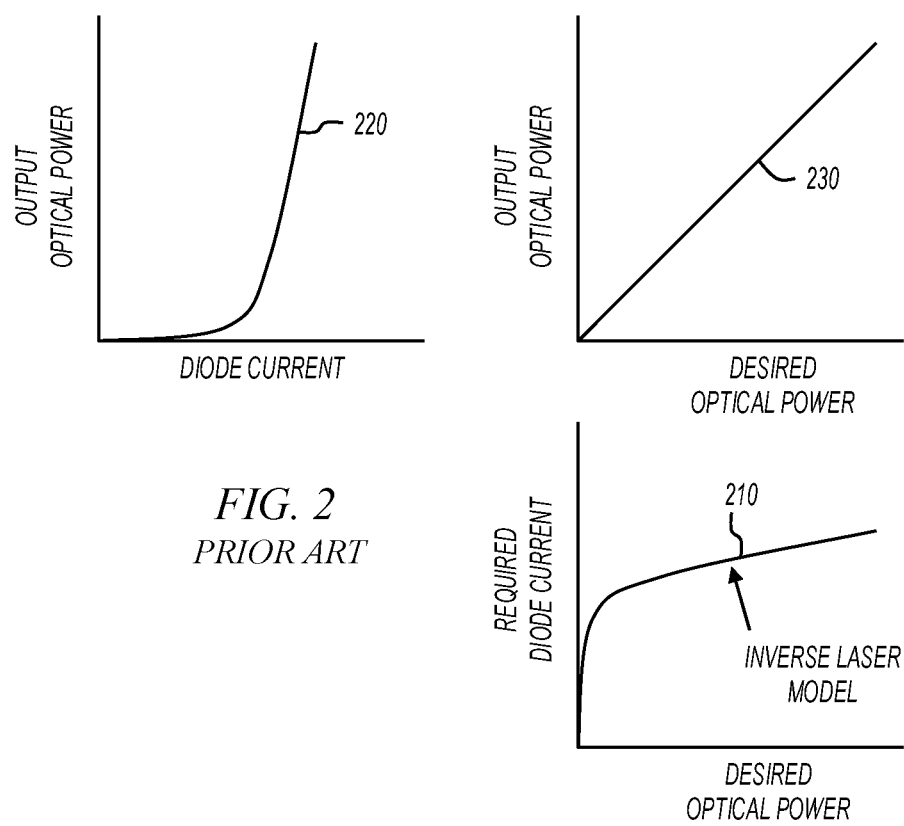
FIG. 2 shows prior art curves used in the drive circuit of FIG. 1.

In some embodiments, an inverse laser model is generated from curve 510. In these embodiments, the laser diode input current to output light power relationship can be linearized (see FIG. 2) for 100 ns pulses, but significant errors are introduced for shorter pulses. As described further below, various embodiments of the present invention determine compensation values that are summed with the desired optical power values for shorter pulse durations to account for these errors.

The non-linear difference between curves 510 and 520 represents errors in optical energies as a function of desired optical power values. These nonlinear differences may be time varying nonlinear operating characteristic of the system that become more pronounced for short pulse durations. Three characteristic areas of the curves have been identified, and are labeled as "knee shift," "slope change," and "roll over." The labels are for convenience only, and are not meant to be limiting in any way.

Figure 6:
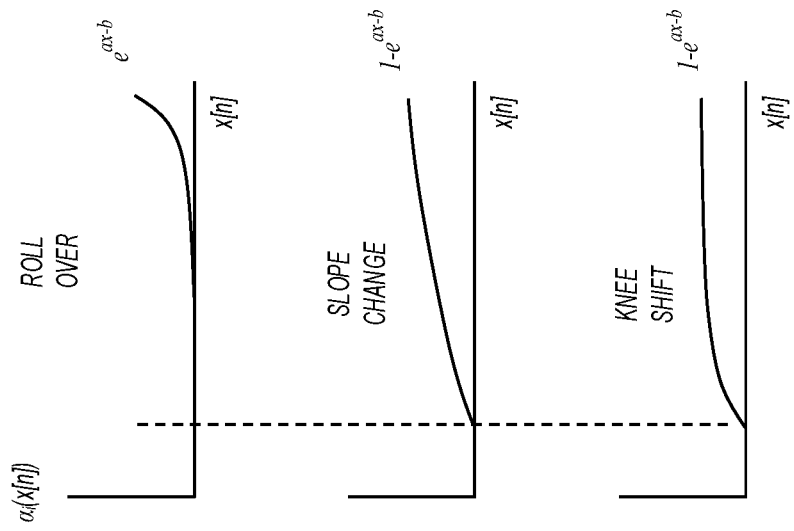
FIG. 6 shows basis functions useful to compensate for time varying nonlinear operating characteristic shown in FIG. 5 in accordance with various embodiments of the present invention.

FIG. 6 shows basis functions useful to compensate for time varying nonlinear operating characteristic shown in FIG. 5 in accordance with various embodiments of the present invention. Each of the basis functions $\alpha_i x[n]$ shown in FIG. 6 is used to determine a component of a compensation value, where that component compensates for a different labeled area of the curve. For example, compensation for the "roll over" portion of the curve can be generated using a basis function of the form:

$$e^{ax+b} \tag{3}$$

and compensation for the "slope change" and "knee shift" portions of the curve can be generated using basis functions of the form:

$$1 - e^{ax+b} \tag{4}$$

where a and b are constants. In some embodiments, the constants a and b are determined from experimental data using well known curve fitting methods.

The basis functions shown in FIG. 6 are examples only. Any function that can compensate for errors may be used. The exponential basis functions shown in FIG. 6 are relatively straight forward to implement in hardware, which makes the exponential form a suitable choice.

Various embodiments of the present invention generate compensation values by summing weighted basis function outputs. For example, a compensated desired optical power may be determined by:

$$y[n] = x[n] + \sum_{i=0}^{N} w_i \alpha_i(x[n]) \tag{5}$$

where y[n] is the compensated desired optical power, x[n] is desired optical power, $\alpha_i(x[n])$ are the basis functions, $w_i$ are weights applied to the basis functions, and N is the number of basis functions. An example embodiment that determines a compensated optical power value according to Eq. (5) is described below with reference to FIG. 7.

Figure 7:
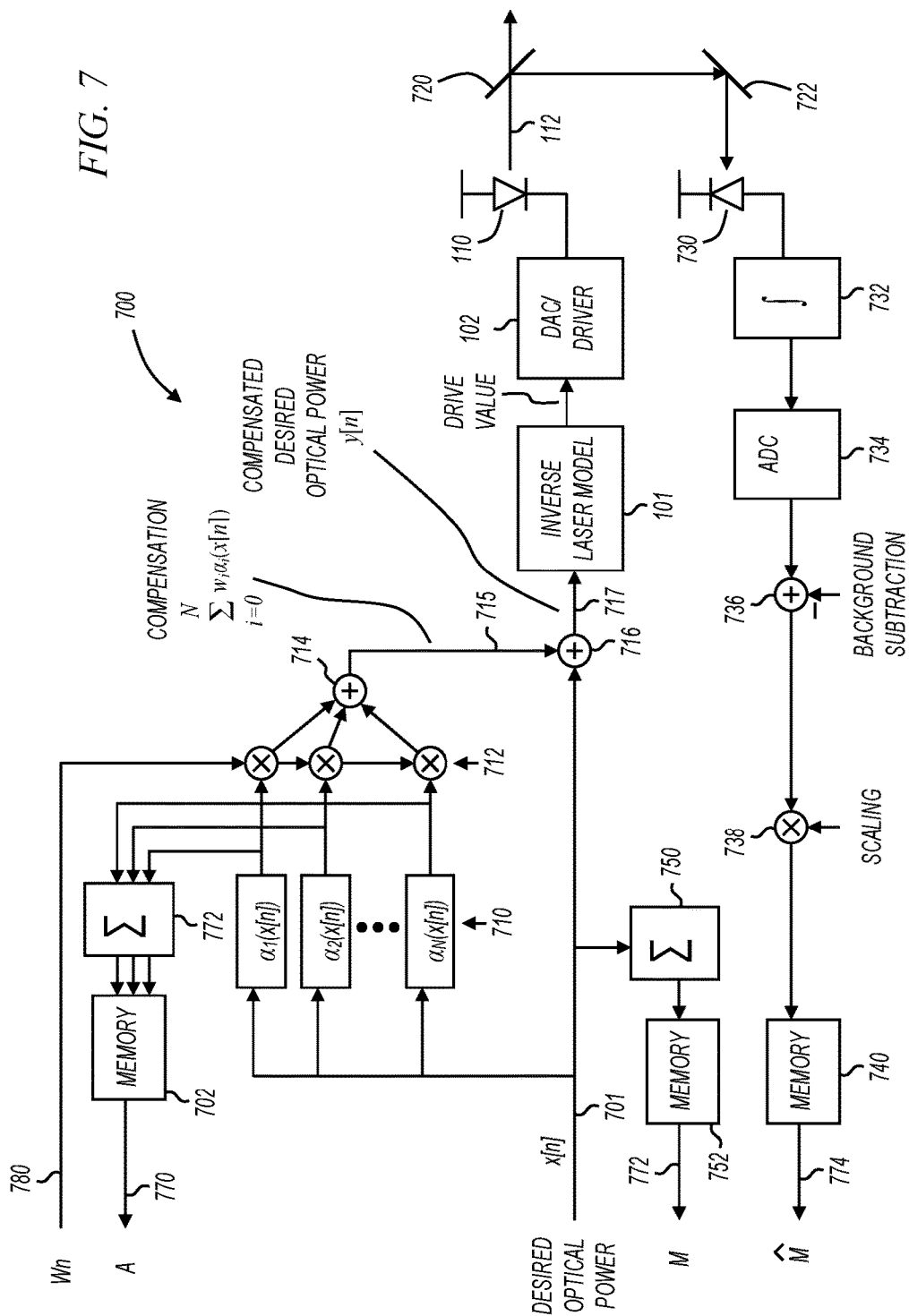
FIG. 7 shows a laser drive circuit with dynamic laser diode compensation in accordance with various embodiments of the present invention.

FIG. 7 shows a laser drive circuit with dynamic laser diode compensation in accordance with various embodiments of the present invention. Laser drive circuit 700 includes memory circuits 702 and 752, accumulators 750 and 772, basis function circuits 710, multipliers 712, summers 714 and 716, inverse laser model 101, DAC/driver 102, and laser diode 110. Laser drive circuit 700 also includes photodiode 730, integrator 732, analog-to-digital converter (ADC) 734, summer 736, multiplier 738, and memory circuit 740.

In operation, a desired optical power value x[n] is received on node 701. The desired optical power value corresponds to a desired optical pulse energy. For example, referring back to FIG. 3B, the desired optical power value on node 701 may be equal to desired optical power 324. In some embodiments, the desired optical power value x[n] is a sequence of discrete values. For example, in some embodiments, x[n] is a sequence of light power values for successive pixels in an image.

Laser drive circuit 700 determines a compensation value on node 715 by summing weighted basis function outputs according to Eq. (5). Basis function circuits 710 determine output values that are a function of the desired optical power value on node 701, multipliers 712 apply weights to the basis function outputs, and summer 714 sums the multiplier outputs to create the compensation value on node 715. Summer 716 then sums the desired optical power value with the compensation value to create the compensated desired optical power value y[n] on node 717. The compensated desired optical power value on node 717 is a drive value that compensates for finite pulse rise times, as well as other nonlinearities in the system. For example, the compensated desired optical power value on node 717 may be equal to compensated desired optical power 414 (FIG. 3).

Inverse laser model 101 maps the compensated desired optical power value on node 717 to a drive value, and DAC/driver circuit 102 converts the drive value to a drive current to drive laser diode 110.

Weights that are applied to basis function outputs are received on node 780. In some embodiments, the weights are updated periodically based on various criteria. For example, the weights may be updated periodically based on past weight values, past basis function outputs, past desired optical power values, and measured optical power values. As shown in FIG. 7, past basis function outputs are represented by accumulated basis function output values A on node 770, past desired optical power values are represented by accumulated desired optical power values M on node 772, and measured optical power values are represented by integrated measured optical power values $\hat{M}$ on node 774. Values may be accumulated and/or integrated for any period of time. For example, in some embodiments, values are accumulated and integrated for a fixed period of time (the "accumulation period"), and in other embodiments, values are accumulated and integrated for a variable period of time.

Accumulator 772 accumulates individual basis function outputs over the accumulation period, and stores the result in memory circuit 702 as a vector A with length N. Similarly, accumulator 750 accumulates desired optical power values over the accumulation period, and stores the result in memory circuit 752 as scalar M.

Pickoff mirror 720 and fold mirror 722 are positioned to reflect at least a portion of the emitted laser light 112 to photodiode 730. Current provided by photodiode 730 represents a scaled version of the optical light power emitted by diode 110. Integrator 732 integrates the photodiode current over the accumulation period, and provides the result to ADC 734. In some embodiments, integrator 732 includes circuit components to integrate the current directly, and in other embodiments, integrator 732 includes a transimpedance amplifier to convert the current to a voltage, and the voltage is integrated.

Summer 736 subtracts a value that corresponds to background light, and multiplier 738 provides a scale factor for unit conversion. The result is stored in memory circuit 740 as $\hat{M}$.

The various circuits shown in FIG. 7 may be implemented in any fashion. For example, memory circuits may include static random access memory semiconductor devices. Accumulators may include digital adder circuits that are resettable at the end of each accumulation period. Basis function circuits may include digital adders, multipliers, registers, state machines, and the like. Multipliers may include digital multipliers, and summers may include digital adders. The inverse laser model may be implemented as a look up table in a digital memory device, or may be a computational device that maps the compensated desired optical power value to a drive value using a mathematical function.

DAC/driver circuit 102 may include any type of digital to analog converter, and may include any type of driver circuit. For example, DAC/driver circuit 102 may include a DAC with a current output or a DAC with a voltage output followed by a voltage-to-current converter to convert the DAC output to the final drive current to drive the laser diode. The DAC may include any width digital word. For example, in some embodiments, the compensated desired optical power is a 10 bit digital word, however, this is not a limitation of the present invention.

Figure 8:
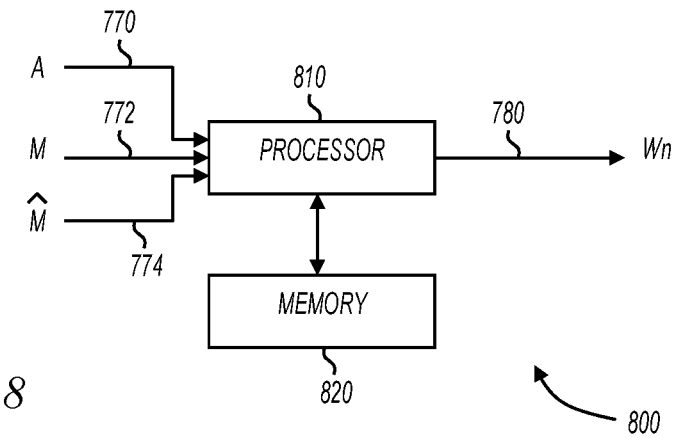
FIG. 8 shows a processing circuit in accordance with various embodiments of the present invention.

FIG. 8 shows a processing circuit in accordance with various embodiments of the present invention. As further described below, processing circuit 800 may implement algorithms that update weights to be applied to basis function outputs. Processing circuit 800 includes processor 810 and memory 820. Memory 820 represents a non-transitory computer-readable medium that stores instructions. When instructions stored in memory 820 are executed, processor 810 determines new values for the weights $w_n$ on node 780.

Processor 810 may be any type of processor capable of executing instructions and performing mathematical calculations. For example, processor 810 may be a microprocessor, a digital signal processor, or the like. Memory 820 may be any type of memory capable of non-transitory storage of processor instructions. For example, memory 820 may a volatile or nonvolatile semiconductor storage device such as static random access memory or FLASH memory. Memory 820 may also include magnetic or optical storage.

In some embodiments, system 800 includes graphics processor(s), field programmable gate array(s) (FPGA), and/or application specific integrated circuit(s) to perform some or all of the described functions.

In operation, processor receives past basis function outputs A on node 770, past desired optical power values M on node 772, and past measured optical power values $\hat{M}$ on node 774, and determines the new weights $w_n$ on node 780. For example, some embodiments determine new weights using an equation of the form:

$$\vec{W}_{n+1} = (1-\alpha)\vec{W}_0 + \alpha\vec{W}_n + \beta(\mu_w + (C_w^{-1} + A^T C_{noise}^{-1} A)^{-1} A^T C_{noise}^{-1} (M - \hat{M} - A\mu_w)) \quad (6)$$

where:

$\vec{W}_{n+1}$ are the new weights,
$\vec{W}_n$ are the existing weights,
$\mu_w$ is the average of past weights,
A are the accumulated basis function outputs,
M are the accumulated desired optical power values,
$\hat{M}$ are the integrated measured optical power values,
$C_w$ is the basis function covariance matrix,
$C_{noise}$ is the measured noise covariance matrix,
$\vec{W}_0$ are the initial weights,
$\alpha$ is a restoring constant (default is 1), and
$\beta$ is a learning constant (default is 1).

In some embodiments, Eq. (6) is solved using a recursive Bayesian approach such as Cholesky Decomposition and Tikhonov Regularization. The Bayesian approach allows the system of equation to be solved even with noisy or little meaningful information collected from the desired optical power values. This is done by measuring the range of real compensator corrections and forcing the solution to remain within these bounds in addition to building on the solutions from previous iterations.

Figure 9:
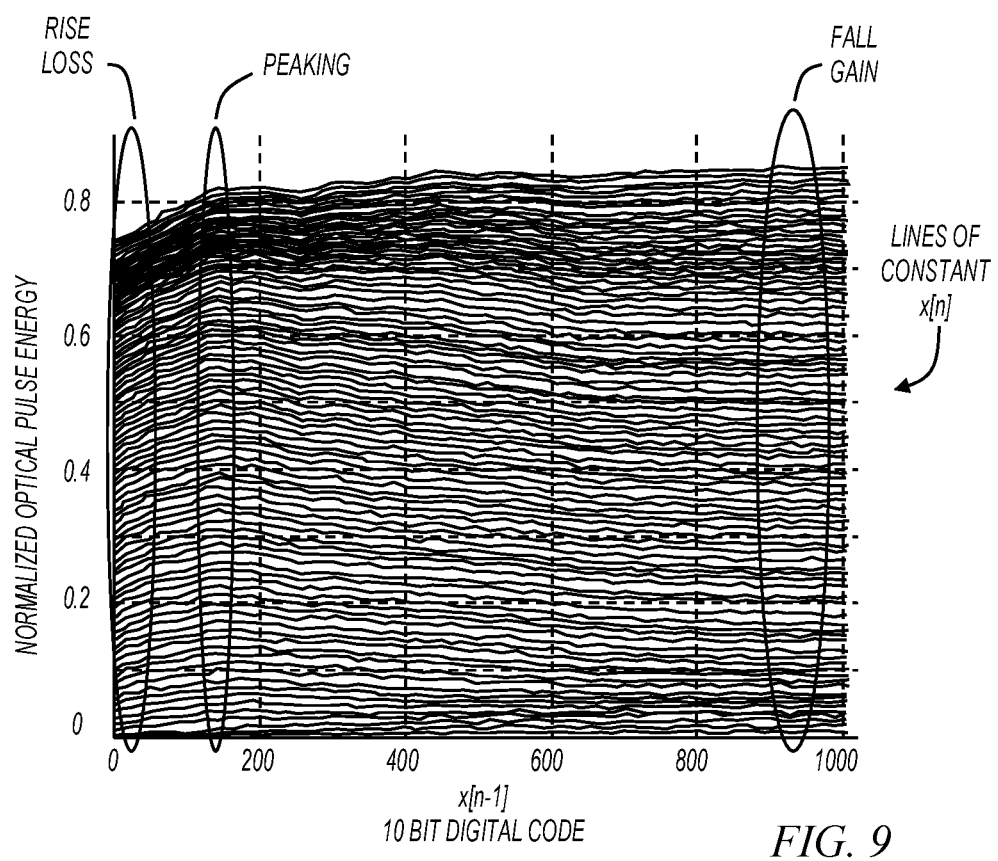
FIGS. 9 and 10 show optical energy variations as a function of previous diode drive values in accordance with various embodiments of the present invention.
Figure 10:
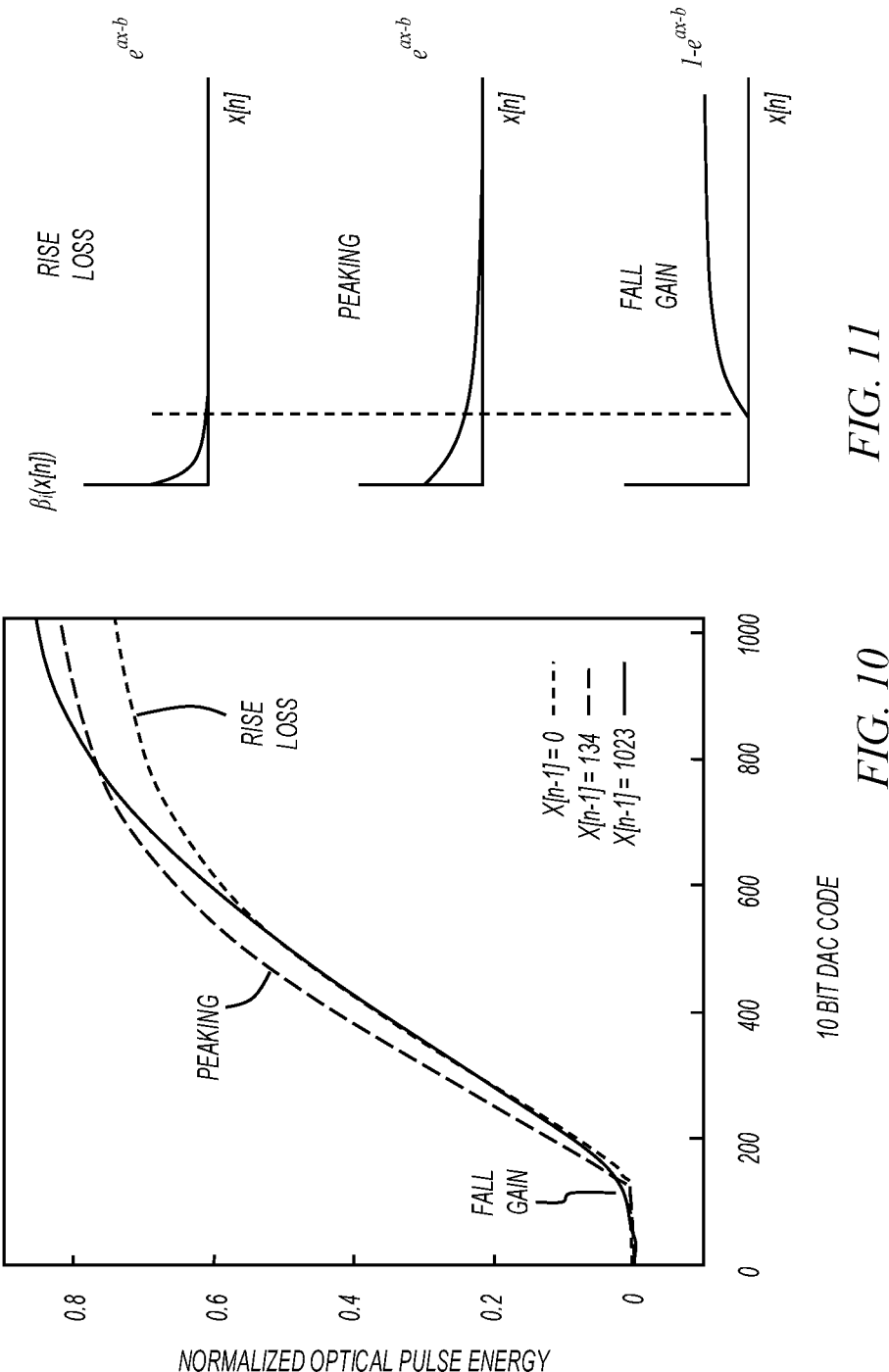

FIGS. 9 and 10 show optical energy variations as a function of previous diode drive values in accordance with various embodiments of the present invention. FIG. 9 shows variations in optical pulse energy for 7 ns pulses as a function of previous diode drive values. The previous diode drive value x[n−1] is shown as a 10 bit digital code for convenience, however this is not a limitation of the present invention. FIG. 9 shows that the maximum energy in a pulse of a given current drive value x[n] is when the previous drive value x[n−1] is near threshold (x[n−1]~130). This suggests that the pulse energy has some relation to laser physics and not just driver rise-time as described above. It should be noted that the relationship is highly non-linear and is very difficult to compensate.

For convenience, three different areas of FIG. 9 have been identified for compensation: "rise loss," "peaking," and "fall gain." These terms are being used as labels only and are not meant to limit the present invention in any way. In the "rise loss" region, previous drive values less than threshold tend to suppress the optical pulse energy of the current drive value. In the "peaking" region, previous drive values around threshold tend to increase the optical pulse energy of the current drive value, and in the "fall gain" region, high previous drive values tend to suppress the optical pulse energy of the current drive for small current drive values.

FIG. 10 shows the same data as FIG. 9, with the independent variable being the current drive value and the plot being parameterized based on previous drive values of zero (minimum drive), 134 (threshold), and 1023 (maximum drive). If the previous code is a zero the pulse will have significantly less energy than a pulse with the previous code near threshold (threshold ~130).

Figure 11:
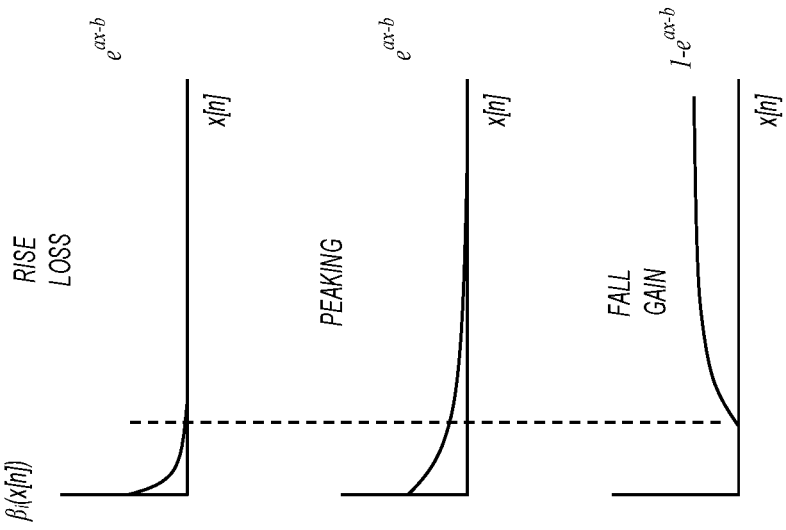
FIG. 11 shows basis functions useful to compensate for the limitations shown in FIGS. 9 and 10 in accordance with various embodiments of the present invention.

FIG. 11 shows basis functions useful to compensate for the limitations shown in FIGS. 9 and 10 in accordance with various embodiments of the present invention. Each of the basis functions $\beta_i x[n-1]$ shown in FIG. 11 is used to determine a component of a compensation value, where that component compensates for a different labeled area of the curve. For example, compensation for the "rise loss" and "peaking" portions of the curve can be generated using basis functions of the form:

$$e^{ax+b} \qquad (7)$$

and compensation for the "fall gain" portion of the curve can be generated using a basis function of the form:

$$1-e^{ax+b} \qquad (8)$$

where a and b are constants. In some embodiments, the constants a and b are determined from experimental data using well known curve fitting methods.

The basis functions shown in FIG. 11 are examples only. Any function that can compensate for errors may be used. The exponential basis functions shown in FIG. 11 are relatively straight forward to implement in hardware, which makes the exponential form a suitable choice.

Various embodiments of the present invention generate compensation values by summing weighted basis function outputs. For example, a compensated desired optical power may be determined by:

$$y[n] = x[n] + \sum_{i=0}^{n} w_i \beta_i(x[n-1]) \qquad (9)$$

where y[n] is the compensated desired optical power, x[n] is desired optical power, x[n−1] is the previous desired optical output power, $\beta_i\{x[n]\}$ are the basis functions, $w_i$ are weights applied to the basis functions, and N is the number of basis functions. An example embodiment that determines a compensated optical power value according to Eq. (9) is described below with reference to FIG. 12.

Figure 12:
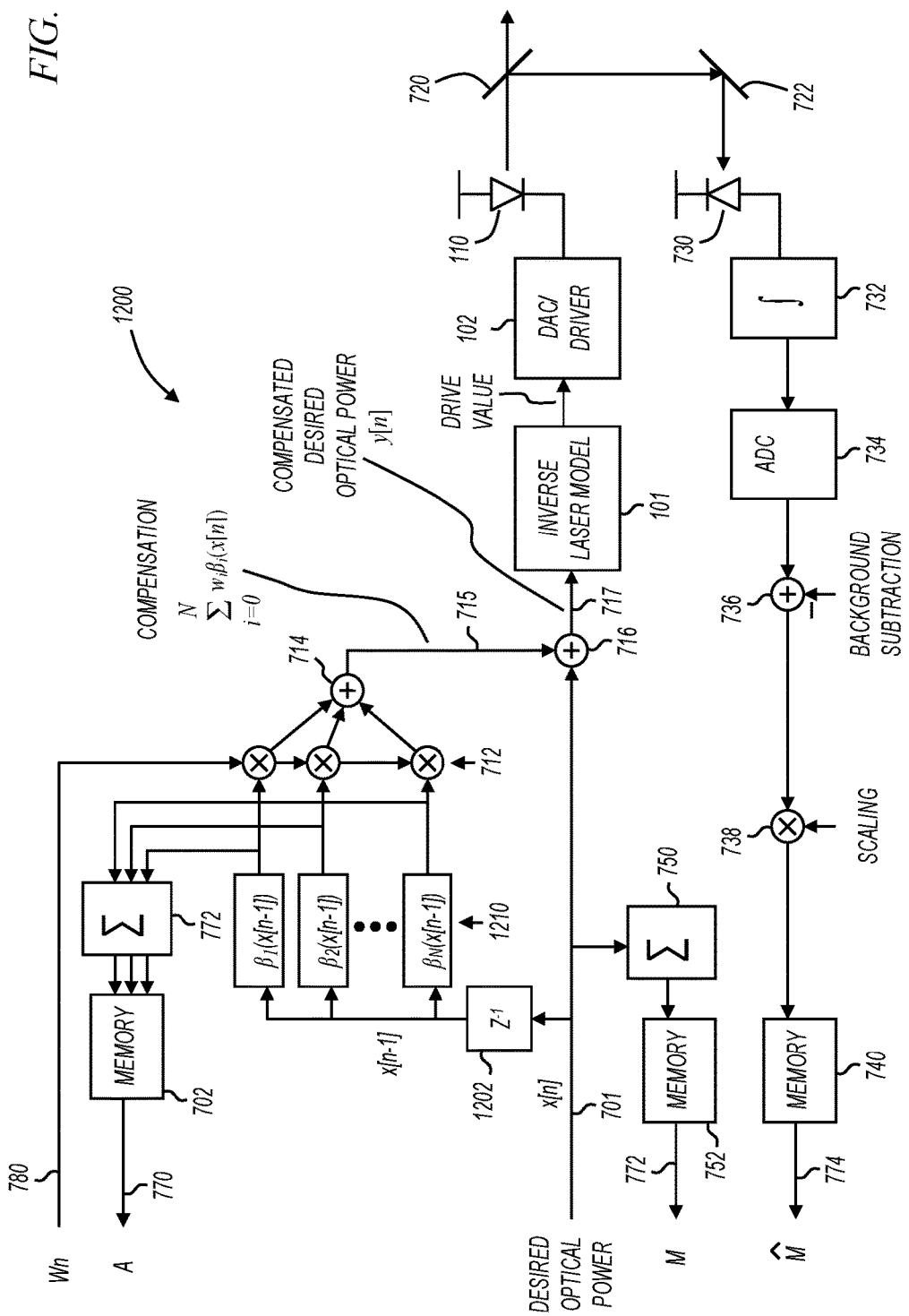
FIGS. 12 and 13 shows laser drive circuits with dynamic laser diode compensation in accordance with various embodiments of the present invention.

FIG. 12 shows a laser drive circuit with dynamic laser diode compensation in accordance with various embodiments of the present invention. Diode drive circuit 1200 is similar to diode drive circuit 700 (FIG. 7) with the exception of basis function circuits 1210 and delay stage 1202. Delay stage 1202 receives the desired optical power value x[n], and delays it by one sample time to produce x[n−1], which is input to basis function circuits 1210. Basis function circuits 1210 receive x[n−1] and determine basis function outputs according to the basis functions shown, and the compensation value on node 715 is the sum of the weighted basis function outputs.

The weights may be updated as described above with reference to FIGS. 7 and 8. For example, laser drive circuit 1200 provides A, M, and $\hat{M}$ to an update circuit capable of determining new weight values according to Eq. (6).

Figure 13:
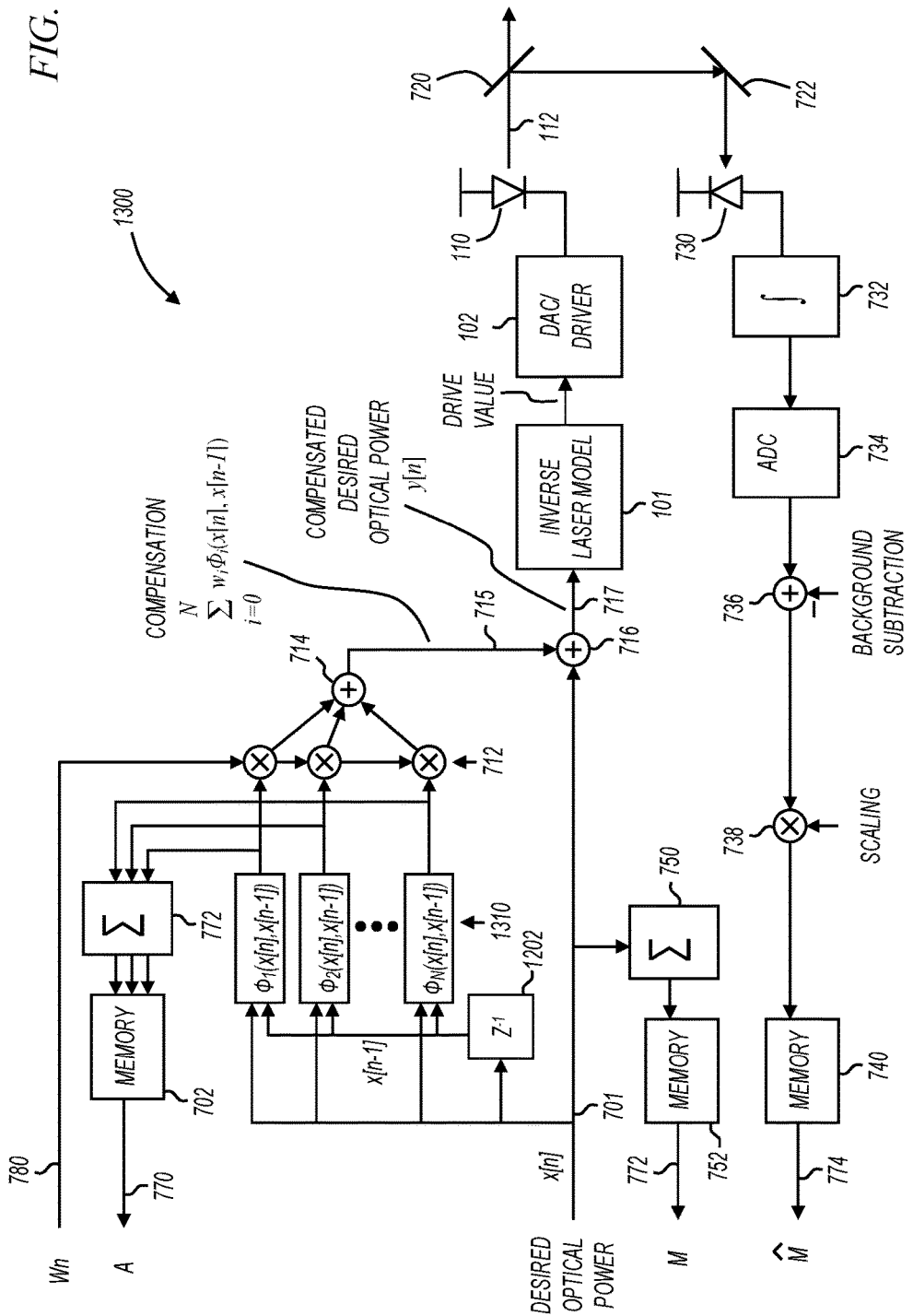

FIG. 13 shows a laser drive circuit with dynamic laser diode compensation in accordance with various embodiments of the present invention. Diode drive circuit 1300 is similar to diode drive circuit 1200 (FIG. 12) with the exception of basis functions circuits 1310. Basis function circuits 1310 receive both x[n] and x[n−1] and determine basis function outputs according to the basis functions shown, and the compensation value on node 715 is the sum of the weighted basis function outputs. This combines the approaches of FIGS. 7 and 12, and results in compensating desired optical power as a function of both the current desired optical power and a past desired optical power. The basis functions may be of the form:

$$y[n] = x[n] + \sum_{i=0}^{n} w_i \phi_i(x[n], x[n-1]) \qquad (10)$$

where the basis functions $\phi_i$ are functions of both the current desired optical power x[n] and a past desired optical power x[n−1]

In some embodiments, the basis functions $\phi_i$ may be decomposed into a product of the basis functions $\alpha_i$ and $\beta_i$. For example, in some embodiments, the basis functions $\phi_i$ may take the form:

$$\phi_i(x[n],x[n-1]) \approx \alpha_i(x[n])\beta_i(x[n-1]). \qquad (11)$$

The weights may be updated as described above with reference to FIGS. 7 and 8. For example, laser drive circuit 1300 provides A, M, and $\hat{M}$ to an update circuit capable of determining new weight values according to Eq. (6).

Figure 14:
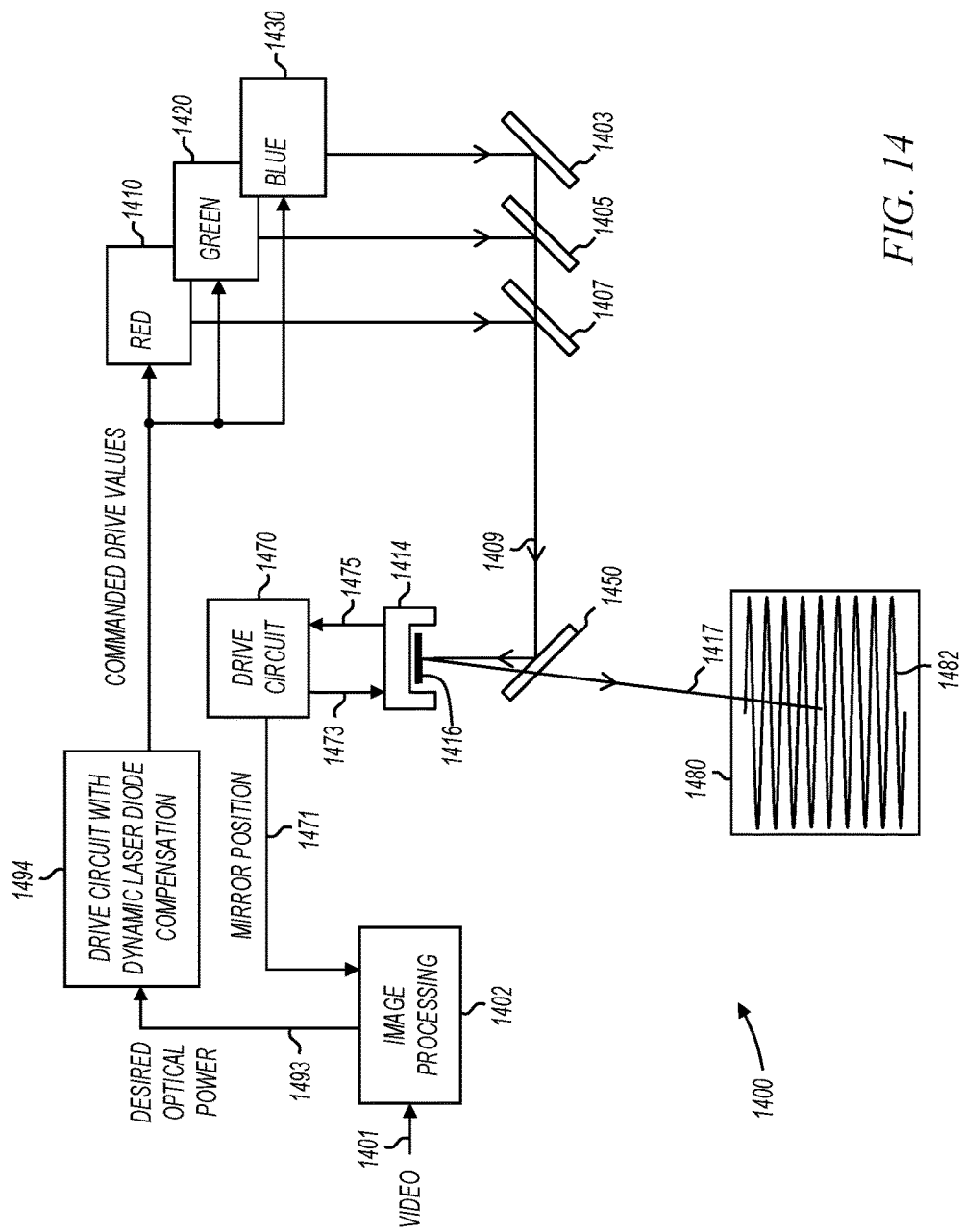
FIG. 14 shows a laser scanning apparatus in accordance with various embodiments of the present invention.

FIG. 14 shows a scanning laser projector in accordance with various embodiments of the present invention. Scanning laser projector 1400 includes image processing component 1402, drive circuit with dynamic laser diode compensation 1494, red laser module 1410, green laser module 1420, and blue laser module 1430. Light from the laser modules is combined with dichroics 1403, 1405, and 1407 to produce combined laser beam 1409. Scanning laser projector 1400 also includes fold mirror 1450, drive circuit 1470, and MEMS device 1414 with scanning mirror 1416.

In some embodiments, image processing component 1402 processes video content at 1401 using two dimensional interpolation algorithms to determine the appropriate spatial image content for each mirror position at which an output pixel is to be displayed. In other embodiments, image processing component 1402 processes the video content by placing pixels without interpolating. This content is then mapped to desired optical power values on node 1493 for each of the red, green, and blue laser light sources.

Drive circuit 1494 receives the desired optical power values on node 1493 and produces commanded drive values for each of the red, green, and blue laser sources such that the output intensity from the lasers is consistent with the input image content. In some embodiments, this process occurs at output pixel rates in excess of 150 MHz.

Drive circuit 1494 provides compensation for dynamic nonlinearities in the system as described with reference to previous figures. For example, drive circuit 1494 may include any of drive circuits 700 (FIG. 7), 1200 (FIG. 12), or 1300 (FIG. 13). Also for example, drive circuit 1494 may include one or more processing circuits 800 (FIG. 8). In these embodiments, the accumulation period may correspond to a period of time related to the video. For example, the accumulation period may correspond to one line of video or one frame of video. Also for example, the accumulation period may correspond to less than one line of video.

Combined laser beam 109 is directed onto an ultra-high speed gimbal mounted two-dimensional bi-axial laser scanning mirror 1416. In some embodiments, this bi-axial scanning mirror is fabricated from silicon using MEMS processes. The vertical axis of rotation is operated quasi-statically and creates a vertical sawtooth raster trajectory. The vertical axis is also referred to as the slow-scan axis. The horizontal axis is operated on a resonant vibrational mode of the scanning mirror. In some embodiments, the MEMS device uses electromagnetic actuation, achieved using a miniature assembly containing the MEMS die and small subassemblies of permanent magnets and an electrical interface, although the various embodiments are not limited in this respect. For example, some embodiments employ electrostatic or piezoelectric actuation. Any type of mirror actuation may be employed without departing from the scope of the present invention. The horizontal resonant axis is also referred to as the fast-scan axis.

In some embodiments, raster scan 1482 is formed by combining a sinusoidal component on the horizontal axis and a sawtooth component on the vertical axis. In these embodiments, output beam 1417 sweeps back and forth left-to-right in a sinusoidal pattern, and sweeps vertically (top-to-bottom) in a sawtooth pattern with the display blanked during flyback (bottom-to-top). FIG. 14 shows the sinusoidal pattern as the beam sweeps vertically top-to-bottom, but does not show the flyback from bottom-to-top. In other embodiments, the vertical sweep is controlled with a triangular wave such that there is no flyback. In still further embodiments, the vertical sweep is sinusoidal. The various embodiments of the invention are not limited by the waveforms used to control the vertical and horizontal sweep or the resulting raster pattern.

A mirror drive circuit 1470 provides a drive signal to MEMS device 1414 on node 1473. The drive signal includes an excitation signal to control the resonant angular motion of scanning mirror 1416 on the fast-scan axis, and also includes a slow-scan drive signal to cause deflection on the slow-scan axis. The resulting mirror deflection on both the fast and slow-scan axes causes output beam 1417 to generate a raster scan 1482 in field of view 1480. In operation, the laser light sources produce light pulses for each output pixel and scanning mirror 1416 reflects the light pulses as beam 1417 traverses the raster pattern.

Mirror drive circuit 1470 also receives a feedback signal from MEMS device 1414 on node 1475. The feedback signal on node 1475 provides information regarding the position of scanning mirror 1416 on the fast-scan axis as it oscillates at a resonant frequency. In some embodiments, the feedback signal describes the instantaneous angular position of the mirror, and in other embodiments, the feedback signal describes the maximum deflection angle of the mirror, also referred to herein as the amplitude of the feedback signal.

In operation, drive circuit 1470 excites resonant motion of scanning mirror 1416 such that the amplitude of the mirror deflection is substantially constant. This provides for a constant maximum angular deflection on the fast-scan axis as shown in raster scan 1482. Drive circuit 1470 also provides mirror position information to image processing component 1402 on node 1471.

Drive circuit 1470 may be implemented in hardware, a programmable processor, or in any combination. For example, in some embodiments, drive circuit 1470 is implemented in an application specific integrated circuit (ASIC). Further, in some embodiments, some of the faster data path control is performed in an ASIC and overall control is provided by a software programmable microprocessor.

Although red, green, and blue laser light sources are shown in FIG. 14, the various embodiments of the invention are not limited by the wavelength of light emitted by the laser light sources. For example, in some embodiments, non-visible light (e.g., infrared light) is emitted instead of, or in addition to, visible light.

The particular dual axis gimbaled MEMS device embodiment is described as an example, and the various embodiments of the invention are not limited to this specific implementation. For example, any combination of scanning mirrors capable of sweeping in two dimensions to reflect a light beam in a raster pattern may be incorporated without departing from the scope of the present invention. Also for example, any combination of scanning mirrors (e.g., two mirrors: one for each axis) may be utilized to reflect a light beam in a raster pattern. Further, any type of mirror drive mechanism may be utilized without departing from the scope of the present invention. For example, in some embodiments, MEMS device 1414 may use a drive coil on a moving platform with a static magnetic field, an in other embodiments, MEMS device 1414 may include a magnet on a moving platform with drive coil on a fixed platform. Further, the mirror drive mechanism may include an electrostatic and/or a piezoelectric drive mechanism.

Figure 15:
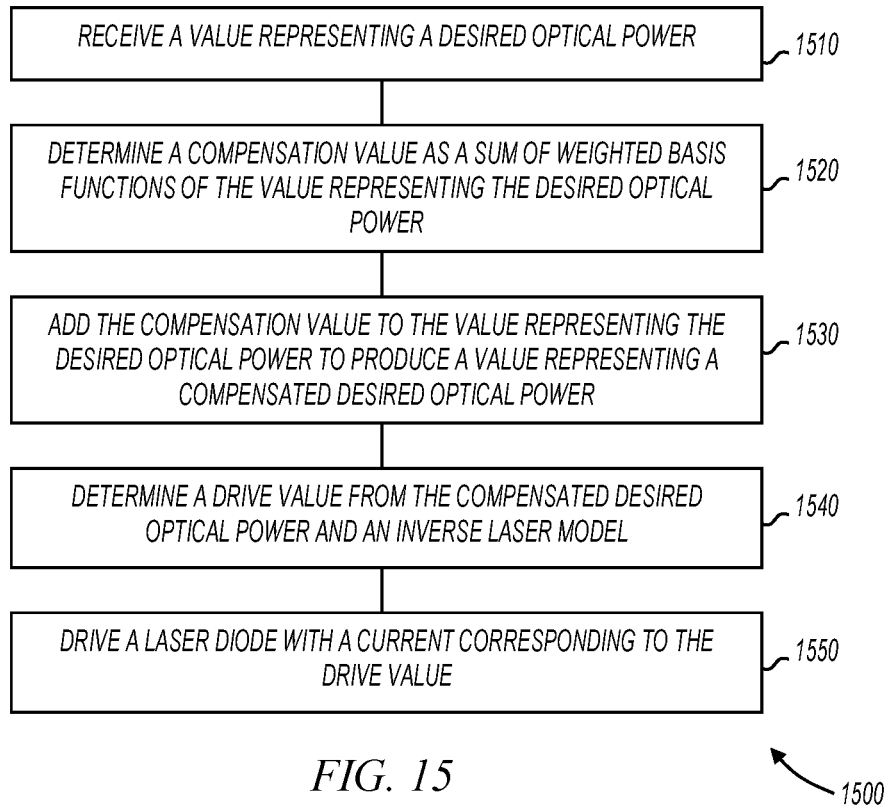
FIGS. 15 and 16 show flow diagrams of methods in accordance with various embodiments of the present invention.

FIG. 15 shows a flow diagram of methods in accordance with various embodiments of the present invention. In some embodiments, method 1500, or portions thereof, is performed by a drive circuit that provides dynamic compensation for system nonlinearities as described above. In other embodiments, method 1500 is performed by a series of circuits or an electronic system such as one of drive circuits 700 (FIG. 7), 1200 (FIG. 12), and 1300 (FIG. 13). Method 1500 is not limited by the particular type of apparatus performing the method. The various actions in method 1500 may be performed in the order presented, or may be performed in a different order. Further, in some embodiments, some actions listed in FIG. 15 are omitted from method 1500.

Method 1500 is shown beginning with block 1510. As shown at 1510, a value representing a desired optical power is received. In some embodiments, this is a digital value that represents an uncompensated desired power value. At 1520, a compensation value is determined as a sum of weighted basis functions of the value of representing the desired optical power. This corresponds to the operation of the basis functions circuits 710 shown in FIG. 7. Is some embodiments, the compensation value is determined as a sum of weighted basis functions of previous desired optical power values. This corresponds to the operation of the basis function circuits 810 shown in FIG. 8. In still further embodiments, the compensation value is determined as a function of both the desired optical power value and previous optical power values. This corresponds to the operation of basis function circuits 1310 as shown in FIG. 13.

At 1530, the compensation value is added to the desired optical power value to produce a compensated optical power value. This corresponds to summer 716 adding the compensation value on node 715 to the desired optical power value on node 701 to produce the compensated desired optical power value on node 717.

At 1540, an inverse laser model (inverse laser model 101, FIGS. 7, 12, 13) is used to determine a drive value, and at 1550, a laser diode (diode 110) is driven with a current (output of DAC/driver 102) corresponding to the drive value.

Figure 16:
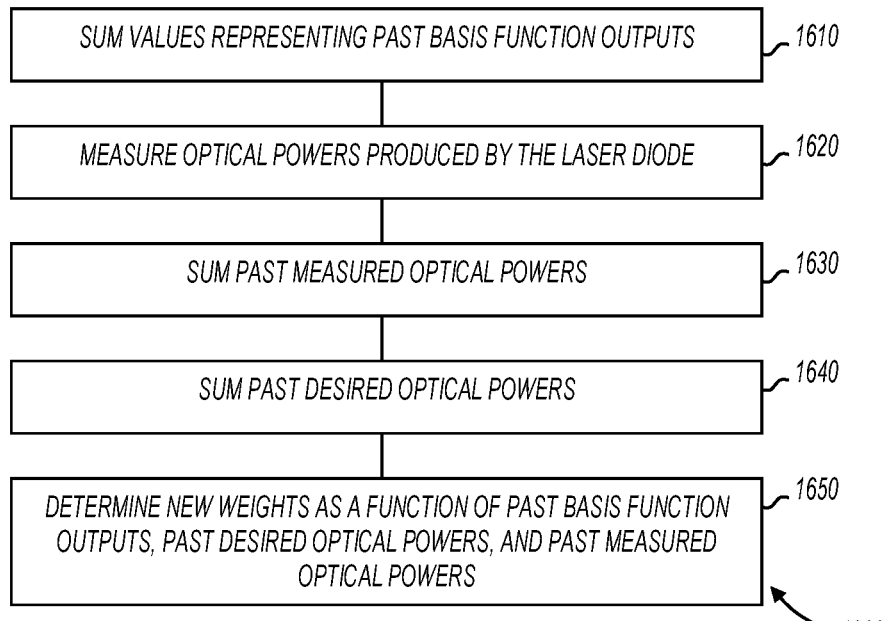

FIG. 16 shows a flow diagram of methods in accordance with various embodiments of the present invention. In some embodiments, method 1600, or portions thereof, is performed by a drive circuit that provides dynamic compensation for system nonlinearities as described above. In other embodiments, method 1600 is performed by a series of circuits or an electronic system such as one of drive circuits 700 (FIG. 7), 1200 (FIG. 12), and 1300 (FIG. 13). Method 1600 is not limited by the particular type of apparatus performing the method. The various actions in method 1600 may be performed in the order presented, or may be performed in a different order. Further, in some embodiments, some actions listed in FIG. 16 are omitted from method 1600.

Method 1600 is shown beginning with block 1610. As shown at 1610, values representing past basis function outputs are summed. This corresponds to the operation of accumulator 772 (FIGS. 7, 12, 13) accumulating the basis function outputs over an accumulation period.

At 1620, optical powers produced by the laser diode are measured, and at 1630, these measured values are summed. In operation, this corresponds to the operation of photodiode 730 along with integrator 732, and ADC 734 (FIGS. 7, 12, 13). At 1640, past desired optical power values are summed. In operation, this corresponds to the operation of accumulator 750.

At 1650, new weights are determined as a function of past basis function outputs, past desired optical powers, and past measured optical powers. In some embodiments, this corresponds to processing circuit 800 (FIG. 8) determining new weights in accordance with Eq. (6).

Figure 17:
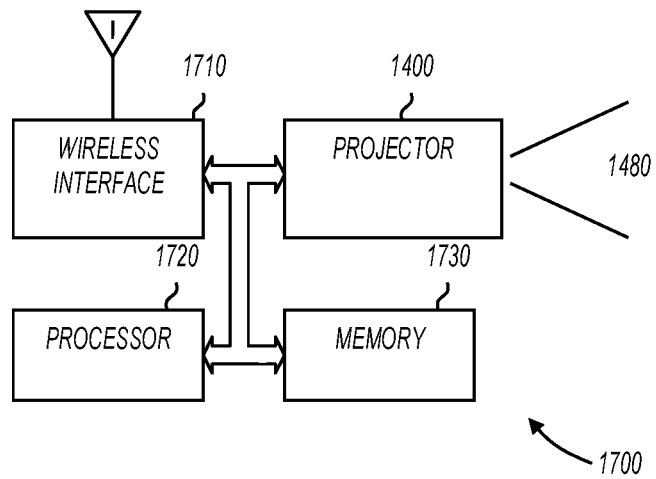
FIG. 17 shows a block diagram of a mobile device in accordance with various embodiments of the present invention.

FIG. 17 shows a block diagram of a mobile device in accordance with various embodiments of the present invention. As shown in FIG. 17, mobile device 1700 includes wireless interface 1710, processor 1720, memory 1730, and scanning laser projector 1400. Scanning laser projector 1400 includes dynamic laser diode compensation circuits as described above.

Scanning laser projector 1400 may receive image data from any image source. For example, in some embodiments, scanning laser projector 1400 includes memory that holds still images. In other embodiments, scanning laser projector 1400 includes memory that includes video images. In still further embodiments, scanning laser projector 1400 displays imagery received from external sources such as connectors, wireless interface 1710, a wired interface, or the like.

Wireless interface 1710 may include any wireless transmission and/or reception capabilities. For example, in some embodiments, wireless interface 1710 includes a network interface card (NIC) capable of communicating over a wireless network. Also for example, in some embodiments, wireless interface 1710 may include cellular telephone capabilities. In still further embodiments, wireless interface 1710 may include a global positioning system (GPS) receiver. One skilled in the art will understand that wireless interface 1710 may include any type of wireless communications capability without departing from the scope of the present invention.

Processor 1720 may be any type of processor capable of communicating with the various components in mobile device 1700. For example, processor 1720 may be an embedded processor available from application specific integrated circuit (ASIC) vendors, or may be a commercially available microprocessor. In some embodiments, processor 1720 provides image or video data to scanning laser projector 1400. The image or video data may be retrieved from wireless interface 1710 or may be derived from data retrieved from wireless interface 1710. For example, through processor 1720, scanning laser projector 1400 may display images or video received directly from wireless interface 1710. Also for example, processor 1720 may provide overlays to add to images and/or video received from wireless interface 1710, or may alter stored imagery based on data received from wireless interface 1710 (e.g., modifying a map display in GPS embodiments in which wireless interface 1710 provides location coordinates).

Figure 18:
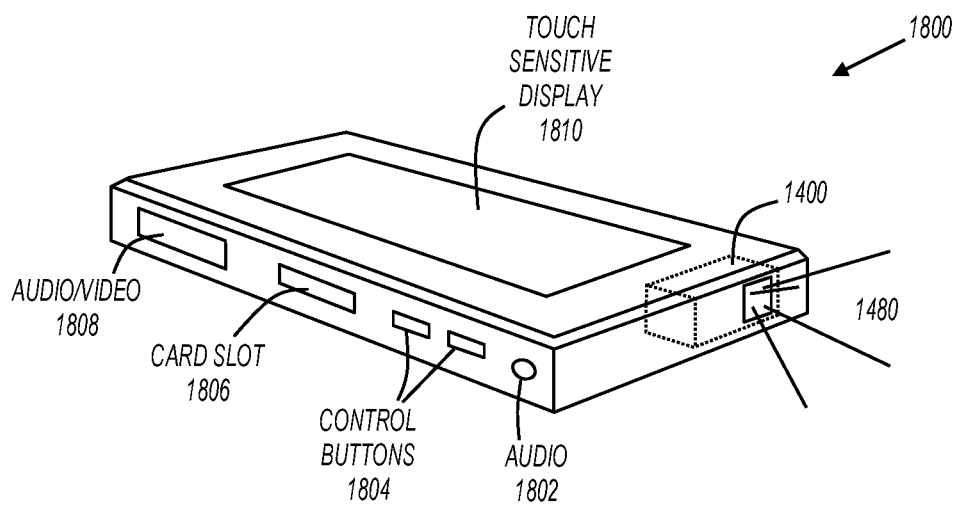
FIG. 18 shows a mobile device in accordance with various embodiments of the present invention.

FIG. 18 shows a mobile device in accordance with various embodiments of the present invention. Mobile device 1800 may be a hand held scanning laser projector with or without communications ability. For example, in some embodiments, mobile device 1800 may be a scanning laser projector with little or no other capabilities. Also for example, in some embodiments, mobile device 1800 may be a device usable for communications, including for example, a cellular phone, a smart phone, a tablet computing device, a global positioning system (GPS) receiver, or the like. Further, mobile device 1800 may be connected to a larger network via a wireless (e.g., cellular), or this device can accept and/or transmit data messages or video content via an unregulated spectrum (e.g., WiFi) connection.

Mobile device 1800 includes scanning laser projector 1400, touch sensitive display 1810, audio port 1802, control buttons 1804, card slot 1806, and audio/video (A/V) port 1808. None of these elements are essential. For example, mobile device 1800 may only include scanning laser projector 1400 without any of touch sensitive display 1810, audio port 1802, control buttons 1804, card slot 1806, or A/V port 1808. Some embodiments include a subset of these elements. For example, an accessory projector may include scanning laser projector 1400, control buttons 1804 and A/V port 1808. A smartphone embodiment may combine touch sensitive display device 1810 and projector 1400.

Touch sensitive display 1810 may be any type of display. For example, in some embodiments, touch sensitive display 1810 includes a liquid crystal display (LCD) screen. In some embodiments, display 1810 is not touch sensitive. Display 1810 may or may not always display the image projected by scanning laser projector 1400. For example, an accessory product may always display the projected image on display 1810, whereas a mobile phone embodiment may project a video while displaying different content on display 1810. Some embodiments may include a keypad in addition to touch sensitive display 1810.

A/V port 1808 accepts and/or transmits video and/or audio signals. For example, A/V port 1808 may be a digital port, such as a high definition multimedia interface (HDMI) interface that accepts a cable suitable to carry digital audio and video data. Further, A/V port 1808 may include RCA jacks to accept or transmit composite inputs. Still further, A/V port 1808 may include a VGA connector to accept or transmit analog video signals. In some embodiments, mobile device 1800 may be tethered to an external signal source through A/V port 1808, and mobile device 1800 may project content accepted through A/V port 1808. In other embodiments, mobile device 1800 may be an originator of content, and A/V port 1808 is used to transmit content to a different device.

Audio port 1802 provides audio signals. For example, in some embodiments, mobile device 1800 is a media recorder that can record and play audio and video. In these embodiments, the video may be projected by scanning laser projector 1400 and the audio may be output at audio port 1802.

Mobile device 1800 also includes card slot 1806. In some embodiments, a memory card inserted in card slot 1806 may provide a source for audio to be output at audio port 1802 and/or video data to be projected by scanning laser projector 1400. Card slot 1806 may receive any type of solid state memory device, including for example secure digital (SD) memory cards.

Figure 19:
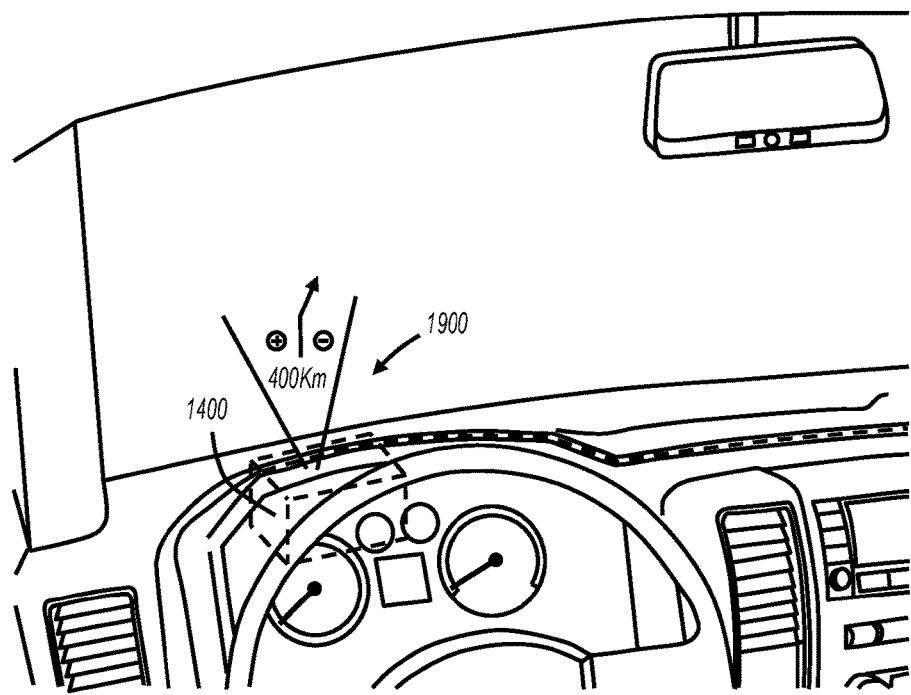
FIG. 19 shows a head-up display system in accordance with various embodiments of the present invention.

FIG. 19 shows a head-up display system in accordance with various embodiments of the invention. Projector 1400 is shown mounted in a vehicle dash to project the head-up display at 1900. Although an automotive head-up display is shown in FIG. 19, this is not a limitation of the present invention. For example, various embodiments of the invention include head-up displays in avionics application, air traffic control applications, and other applications.

Figure 20:
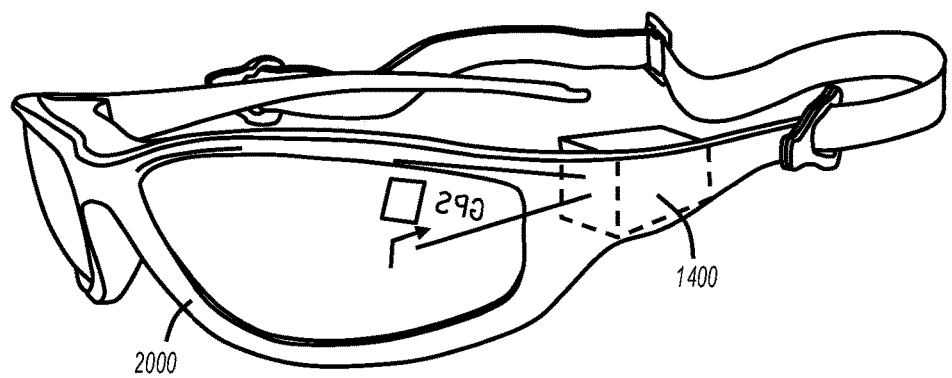
FIG. 20 shows eyewear in accordance with various embodiments of the present invention.

FIG. 20 shows eyewear in accordance with various embodiments of the invention. Eyewear 2000 includes projector 1400 to project a display in the eyewear's field of view. In some embodiments, eyewear 2000 is see-through and in other embodiments, eyewear 2000 is opaque. For example, eyewear 2000 may be used in an augmented reality application in which a wearer can see the display from projector 1400 overlaid on the physical world. Also for example, eyewear 2000 may be used in a virtual reality application, in which a wearer's entire view is generated by projector 1400. Although only one projector 1400 is shown in FIG. 20, this is not a limitation of the present invention. For example, in some embodiments, eyewear 2000 includes two projectors; one for each eye.

Figure 21:
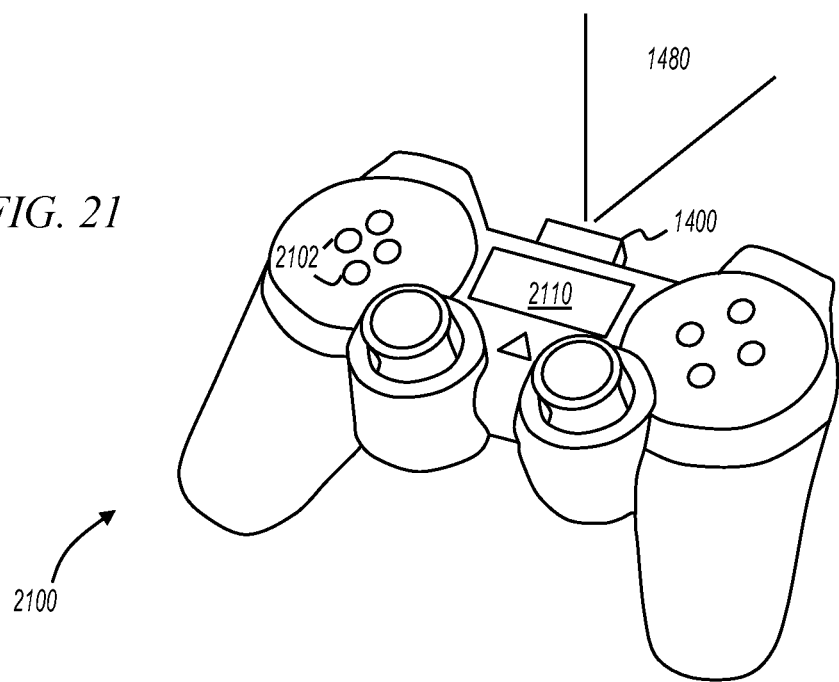
FIG. 21 shows a gaming apparatus in accordance with various embodiments of the present invention.

FIG. 21 shows a gaming apparatus in accordance with various embodiments of the present invention. Gaming apparatus 2100 includes buttons 2102, display 2110, and projector 1400. In some embodiments, gaming apparatus 2100 is a standalone apparatus that does not need a larger console for a user to play a game. For example, a user may play a game while watching display 2110 and/or the projected content at 1480. In other embodiments, gaming apparatus 2100 operates as a controller for a larger gaming console. In these embodiments, a user may watch a larger screen tethered to the console in combination with watching display 2110 and/or projected content at 1480.

Although the present invention has been described in conjunction with certain embodiments, it is to be understood that modifications and variations may be resorted to without departing from the scope of the invention as those skilled in the art readily understand. Such modifications and variations are considered to be within the scope of the invention and the appended claims.

What is claimed is:

1. An apparatus comprising:
    a laser diode that exhibits a time varying nonlinear operating characteristic based at least upon past drive currents;
    a plurality of circuits to calculate basis function outputs as a function of desired optical power values, wherein the basis functions are chosen to provide compensation for the time varying nonlinear operating characteristic;
    a plurality of multipliers to weight the basis function outputs, and a first summer to create a compensation value from the multiplier outputs;
    a second summer to add the compensation value to the desired optical power value to create a compensated desired optical power value;
    an inverse laser model circuit to map compensated desired optical power value to a drive value; and
    a digital-to-analog converter and drive circuit to receive the drive value and to drive the laser diode.

2. The apparatus of claim 1 further comprising:
    a photodiode to measure optical power produced by the laser diode;
    an integrator to integrate the output of the photodiode;
    an analog-to-digital converter to digitize an output of the integrator to create $\hat{M}$; and
    an accumulator to accumulate desired optical power values to create M.

3. The apparatus of claim 2 wherein the desired optical power values represent pixels in an image, and the integrator integrates over one line of pixels in the image.

4. The apparatus of claim 2 further comprising a processing system to modify weights as a function of M, $\hat{M}$, and past weights.

5. The apparatus of claim 4 wherein the processing system calculates the weights as:

$$\vec{W}_{n+1} = (1-\alpha)\vec{W}_0 + \alpha\vec{W}_n + \beta(\mu_w + (C_w^{-1} + A^T C_{noise}^{-1} A)^{-1} A^T C_{noise}^{-1}(M - \hat{M} - A\mu_w))$$

where:

$\vec{W}_{n+1}$ are the new weights, $\vec{W}_n$ are the existing weights, $\mu_w$ is A are the accumulated basis function outputs, M are the accumulated desired optical power values, $\hat{M}$ are the integrated measured optical power values, $C_w$ is the basis function covariance matrix, $C_{noise}$ is the measured noise covariance matrix, $\vec{W}_0$ are the initial weights, α is a restoring constant (default is 1), and β is a learning constant (default is 1).

6. The apparatus of claim 1 wherein the basis function outputs are at least a function of a present desired optical power value.

7. The apparatus of claim 1 wherein the basis function outputs are at least a function of a past desired optical power value.

8. The apparatus of claim 1 wherein the basis function outputs are a function of both present and past desired optical power values.

9. The apparatus of claim 1 further comprising at least one scanning mirror to reflect light produced by the laser diode in a raster pattern.

10. An apparatus comprising:
    a plurality of basis function circuits to receive a desired optical power value and produce basis function outputs as a function of the desired optical power value;
    a plurality of multipliers to produce weighted basis function outputs from weight values and the basis function outputs;
    a summer to sum the weighted basis function outputs to produce a compensation value to be applied to the desired optical power value; and
    a circuit to adaptively modify the weight values from past weight values, past desired optical power values, and past measured optical power values.

11. The apparatus of claim 10 further comprising a delay stage to delay the desired optical power value, wherein the plurality of basis function circuits produce the basis function outputs from delayed desired optical power values.

12. The apparatus of claim 10 further comprising a delay stage to delay the desired optical power value, wherein the plurality of basis function circuits produce the basis function outputs from a combination of desired optical power values and delayed desired optical power values.

13. The apparatus of claim 10 wherein the circuit to adaptively modify the weight values comprises a processor and a non-transitory storage medium encoded with instructions that when executed by the processor result in modifying the weight values.

14. The apparatus of claim 13 wherein the processing system calculates the weights as a function of past basis function outputs, past measured optical powers, and past desired optical powers.

15. A method comprising:
receiving a value representing a desired optical power;
determining a compensation value as a sum of weighted basis functions of the value representing the desired optical power;
adding the compensation value to the value representing the desired optical power to produce a value representing a compensated desired optical power;
determining a drive value from the compensated desired optical power and an inverse laser model; and
driving a laser diode with a current corresponding to the drive value.

16. The method of claim 15 wherein determining a compensation value comprises determining a compensation value as a sum of weighted basis functions of the value representing the desired optical power and past values representing desired optical powers.

17. The method of claim 15 further comprising summing past basis function output values.

18. The method of claim 17 further comprising measuring optical powers produced by the laser diode.

19. The method of claim 18 further comprising summing past measured optical powers produced by the laser diode.

20. The method of claim 19 further comprising determining new weights as a function of the past basis function outputs, the past measured optical powers, and the past desired optical powers.

* * * * *